United States Patent [19]

Svetanoff

[11] Patent Number: 4,962,358
[45] Date of Patent: Oct. 9, 1990

[54] INTEGRITY MONITORING METHOD AND SYSTEM FOR SHIELDED ENCLOSURES HAVING A FIBER OPTIC CABLE FOR BIDIRECTIONAL COMMUNICATIONS BETWEEN A RECEIVER AND TRANSMITTER THEREOF

[75] Inventor: Dale G. Svetanoff, Arlington Heights, Ill.

[73] Assignee: The Curran Company, Glendale Heights, Ill.

[21] Appl. No.: 344,284

[22] Filed: Apr. 27, 1989

[51] Int. Cl.⁵ .................. G01R 27/00; H04B 17/00
[52] U.S. Cl. ..................................... 324/627; 324/639; 324/95; 455/67
[58] Field of Search ............. 324/57 R, 58 A, 58.5 A, 324/475, 539, 95, 96, 627, 628, 612, 639, 637; 174/35 MS, 35 R; 455/67, 68, 69, 70, 93, 115, 226

[56] References Cited

U.S. PATENT DOCUMENTS

| | | | |
|---|---|---|---|
| 3,492,568 | 1/1970 | Johnson | 324/57 |
| 4,048,564 | 9/1977 | Gleeson, Jr. | 455/67 X |
| 4,176,318 | 11/1979 | Johnson et al. | 455/115 |
| 4,234,964 | 11/1980 | Cieslak et al. | 455/67 X |
| 4,710,944 | 12/1987 | Nossen | 455/69 X |
| 4,731,796 | 3/1988 | Masterton et al. | 455/93 X |

FOREIGN PATENT DOCUMENTS 2611333 8/1988 France .................. 174/35 MS

OTHER PUBLICATIONS

Miller, Jr. et al, Measurements of Steep-Front Impulse Waves with an Isolated Screen Room Installation, Jul. 1958.

Primary Examiner—Gerard R. Strecker
Assistant Examiner—Jack B. Harvey
Attorney, Agent, or Firm—Mason, Kolehmainen, Rathburn & Wyss

[57] ABSTRACT

An improved RF shielding integrity monitoring system is provided for monitoring the shielding integrity of a shielded enclosure that accurately identifies degraded shielding effectiveness and leakage areas in the shielded enclosure. The RF shielding integrity monitoring system performs self-testing and self-diagnostic routines to assure proper system operation prior to monitoring of the shielded enclosure. The RF shielding integrity monitoring system includes a transmitter for transmitting predetermined transmitted by the shielded enclosure for receiving the signals; a receiver separated from the transmitted predetermined signals and for identifying the shielding effectiveness of the shielded enclosure; and a cable connected to the transmitter and the receiver for communicating signals between the transmitter and the reciever.

22 Claims, 1 Drawing Sheet

INTEGRITY MONITORING METHOD AND SYSTEM FOR SHIELDED ENCLOSURES HAVING A FIBER OPTIC CABLE FOR BIDIRECTIONAL COMMUNICATIONS BETWEEN A RECEIVER AND TRANSMITTER THEREOF

BACKGROUND OF THE INVENTION

1. Field of the Invention

The present invention relates to radio frequency (RF) monitoring systems, and more particularly to RF integrity monitoring systems for shielded enclosures.

2. Description of the Prior Art

Shielded enclosures are used when sensitive equipment or the like must be isolated from interference due to ambient electromagnetic radiation. An enclosure may also be used to confine radiation within the enclosure. When a shielded enclosure is first installed, the RF shielding effectiveness is at its maximum. After installation shielding effectiveness of the enclosure should be periodically tested to identify degradation of the shielded enclosure and RF energy leakage through the enclosure.

Integrity monitoring systems are used for testing the shielding performance of an enclosure to attenuate interference. Integrity monitoring systems typically include an RF transmitter with ar antenna on the outside of a shielded enclosure under test and a receiver with an antenna within the enclosure. Transmitted RF signals are detected by the receiver corresponding to the energy transmitted through the enclosure under test. However, extraneous, interference signals can be detected by the receiver to provide erroneous leakage indications for the shielded enclosure.

Another disadvantage of many known integrity monitoring systems is the lack of self-testing or self-diagnostics capability so that any hardware problems, such as in the receiver or the transmitter, tend to introduce inaccuracies.

SUMMARY OF THE INVENTION

A principal object of the present invention is to provide an improved RF shielding integrity monitoring system for monitoring the shielding integrity of a shielded enclosure that overcomes many of the disadvantages of the prior art systems. Other objects are to provide an improved RF shielding integrity monitoring system for monitoring the shielding integrity of a shielded enclosure that effectively and accurately identifies degraded shielding effectiveness and leakage areas in the shielded enclosure; to provide such RF shielding integrity monitoring system capable of both performing self-testing and self-diagnostics routines and identifying an interference condition resulting from extraneous, interference signals to avoid erroneous leakage indications; and to provide such RF shielding integrity monitoring system including a bidirectional communications link between a transmitter and a receiver of the RF shielding integrity monitoring system.

In brief, the objects and advantages of the present invention are achieved by a shielding integrity monitoring system for monitoring the shielding integrity of a shielded enclosure including a transmitter for transmitting predetermined signals; a receiver separated from the transmitter by the shielded enclosure for receiving the transmitted predetermined signals and for identifying the shielding effectiveness of the shielded enclosure; and a cable connected to the transmitter and the receiver for communicating signals between the transmitter and the receiver.

BRIEF DESCRIPTION OF THE DRAWINGS

The present invention together with the above and other objects and advantages may best be understood from the following detailed description of the embodiment of the invention illustrated in the drawings, wherein.

DETAILED DESCRIPTION OF THE PREFERRED EMBODIMENT

Figure 1:
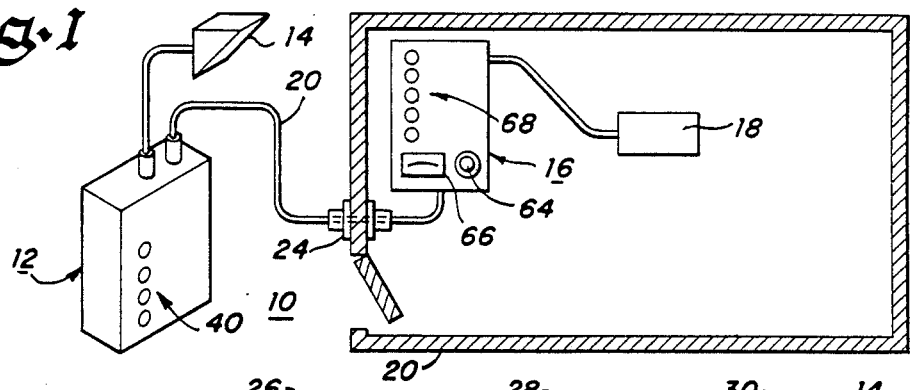
FIG. 1 is a block diagram of an RF shielding integrity monitoring system according to the present invention.

Referring now to the drawings, in FIG. 1 there is illustrated an RF shielding integrity monitoring system generally designated by the reference numeral 10 for monitoring the shielding integrity of a shielded enclosure according to the invention. As its major components, the RF shielding integrity monitoring system 10 includes a transmitter 12 with an associated antenna 14 for transmitting predetermined test signals, a receiver 16 with an associated antenna 18 for receiving the predetermined test signals and for identifying shielding effectiveness and a direct bidirectional communications link or cable 20 connected between the transmitter 12 and the receiver 16.

While the system 10 is illustrated in FIG. 1 with the receiver 16 and antenna 18 mounted inside a shielded enclosure 22 being monitored and the transmitter 12 and antenna 14 mounted outside the shielded enclosure 22, it should be understood that the principles of the invention are not limited to this arrangement. Alternatively, the receiver 16 and antenna 18 can be mounted outside with the transmitter 12 and antenna 14 mounted inside the shielded enclosure 22, depending upon the particular application requirements.

A pair of optical fibers or duplex fiber optic cable with a radio frequency nonconductive jacket advantageously is used for the bidirectional communication link 20 to avoid introducing RF interference or leakage signals by the link 20. A conventional waveguide assembly 24 is mounted through the shielded enclosure 22 being monitored for receiving the fiber optic communication link 20. The transmit antenna 14 and the receiving antenna 18 are mounted at selected locations to provide generally uniform RF illumination of a door of the shielded enclosure 22 and are positioned to have the same polarity, such as horizontal polarity.

In accordance with important features of the present invention, the RF shielding integrity monitoring system 10 performs self-testing and self-diagnostics routines to identify proper operation of all of the component parts of system 10 prior to testing the shielding effectiveness of enclosure 22. During monitoring operation by the system 10, interference signals are identified so that erroneous leakage indications for the shielded enclosure that otherwise would result from extraneous, interference signals are avoided utilizing the direct bidirectional communications link 20 between the transmitter 12 and the receiver 16. A portable leak locator antenna 18A (FIG. 3) is used with the receiver 16 during an alternative monitoring operation by the system 10 to perform leakage field strength measurements in order to identify a leakage point or leakage points in the shielded enclosure.

On start-up for testing, the receiver 16 performs self-testing by injecting an RF signal with a test pulse train signal into its antenna 18. Upon satisfactory self-testing, then the receiver 16 provides a start command via the communications link 20 to activate the RF circuitry of the transmitter 12. Transmitter 12 sends an acknowledge signal to the receiver 12 and performs self-diagnostics and then provides status and test pulse train signals to the receiver 16 via the direct bidirectional communications link 20. When a failure results in either the transmitter 12, receiver 16 or fiber optic link 20 of the system 10, then a particular failure indication is displayed. Otherwise, when correct operation of the component parts of system 10 is established, then testing the shielding effectiveness of the shielded enclosure is performed. During the test monitoring operation by the system 10, the transmitter 12 sends clock data signals to the receiver 16 via the communications link 20. Receiver 16 compares the test signals received by the antenna 18 with the clock data signals from link 20 to identify interference signals.

Figure 2:
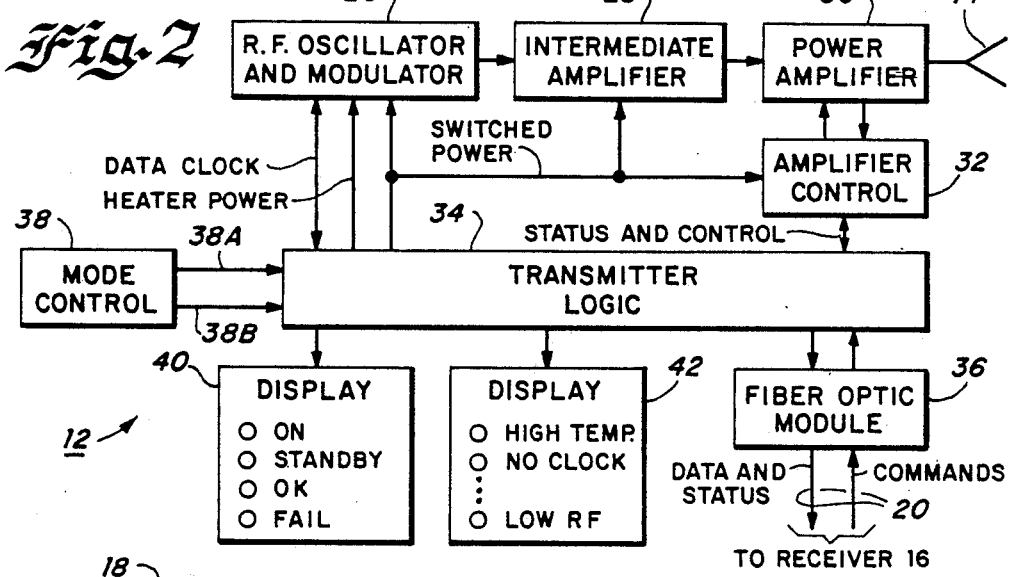
FIG. 2 is a block diagram of a transmitter of the RF shielding integrity monitoring system of FIG. 1.

Referring to FIG. 2, there is shown a block diagram representation of the transmitter 12. Transmitter 12 transmits predetermined test signals, for example, of the order of 915 MHz at a constant output level, such as 2 watts, nominal. The predetermined test signals are applied to the transmit antenna 14 via an RF oscillator and modulator 26, an intermediate amplifier 28 and a power amplifier 30. The selected frequency of 915 MHz provides a test signal wavelength of about 33 cm. suitable for detecting small RF leakage locations. An amplifier control circuit 32 is operatively associated with the power amplifier 30.

A transmitter logic circuit 34 provides power and control signals and detects the operation of the RF oscillator and modulator 26, the intermediate amplifier 28 and the power amplifier 30. The transmitter logic circuit 34 is coupled to the receiver 16 via a fiber optic module 36 connected to the fiber optic cable 20 for receiving command signals from the receiver 16 and for providing status, clock and data signals to the receiver 16. The transmitter logic circuit 34 applies switched power and level control signals to the amplifier control circuit 32. Switched power control signals also are applied to the intermediate amplifier 28 and the RF oscillator and modulator 26 by the transmitter logic circuit 32. Heater power signals for maintaining uniform temperature are applied by the transmitter logic circuit 32 to the RF oscillator and modulator 26 for providing accurate and consistent transmitted test signals.

A mode control module 38 coupled to the transmitter logic circuit 32 provides signals indicating user selections for controlling the operational modes of the transmitter 12. Manual operation of a first push button switch of module 38 provides a signal at line 38A to initiate one timed transmit cycle. A second toggle switch of module 38 provides signals at a line 38B indicating user selections for either an automatic cycle AUTO or a locked continuous transmit cycle CONT. In the selected CONT locked continuous transmit cycle mode, the transmitter 12 sequentially repeats the transmitter operations for the automatic cycle. Ordinarily, the mode control toggle switch of module 38 is provided in the AUTO position. During installation of the system 10, the toggle switch is moved to the CONT position to facilitate adjustment of antennae 14 and 18. During testing operation to perform repeated field strength measurements, for example, for identifying a leakage point, the toggle switch is moved to the CONT position.

A display 40 driven by the transmitter logic circuit 32 includes a plurality of status indicators for viewing by the user, such as POWER-ON, STANDBY, TRANSMITTER OK and TRANSMITTER FAIL. A second internal display 42 coupled to the transmitter logic circuit 32 is used for identifying the cause of the TRANSMITTER FAIL status as indicated by display 40. The second internal display 42 includes a second set of status indicators of monitored operations including HIGH TEMPERATURE of the power amplifier 30, NO CLOCK for the transmitter logic 34 or RF oscillator and modulator 26, LOW RF output from the power amplifier 30, HIGH SWR output connection problems to the antenna 14 and OVER-DRIVE of critical RF amplifier voltages.

Figure 3:
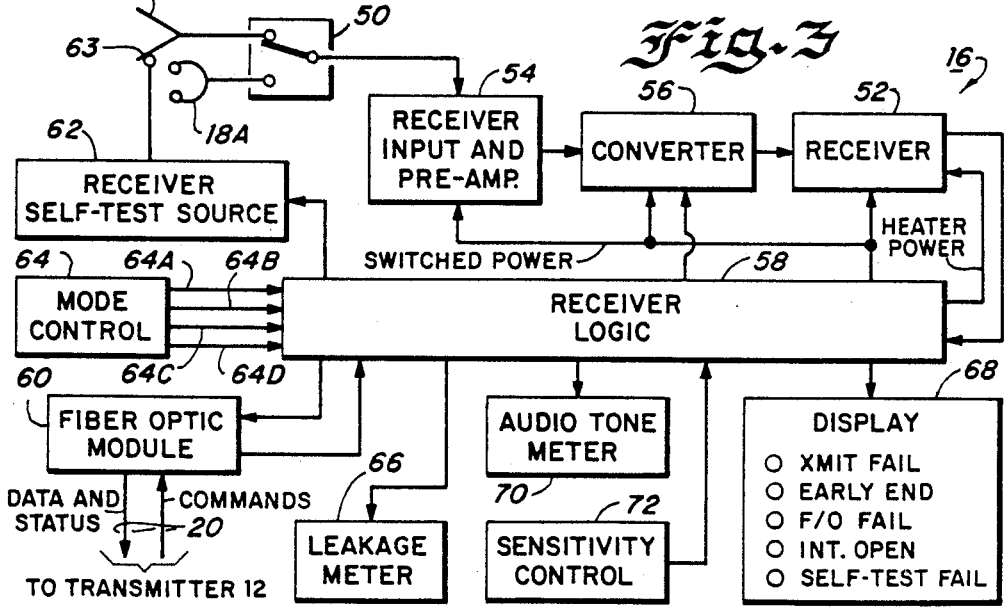
FIG. 3 is a block diagram of a receiver of the RF shielding integrity monitoring system of FIG. 1.

Referring to FIG. 3, there is shown a block diagram representation of the receiver 16. An antenna selecting switch 50 couples received signals from either the receiving antenna 18 or the portable leak locater antenna 18A being used for the particular monitoring operation. Received signals are applied to a receiver 52 via the antenna selecting switch 50, an input and pre-amplifier 54 and a receiving converter 56 that provide bandpass filtering and voltage clamping protection for the receiver 52. A triple conversion superheterodyne FM receiver with automatic frequency control can be used for the receiver 52.

The received signals are applied to a receiver logic circuit 58 coupled to the receiver 52. The receiver logic circuit 58 is coupled to the transmitter 12 via a fiber optic module 60 connected to the fiber optic cable 20 for sending receiver command signals to the transmitter 12 and for receiving transmitter status, clock and data signals from the transmitter 12. The receiver logic circuit 58 is coupled to the receiving converter 56 for providing level control and switched power control signals. Switched power control signals also are applied to the receiver input and pre-amplifier 54 and the receiver 52. Heater power control signals are applied to the receiver 52 by the receiver logic circuit 58.

A receiver self-test source 62 with an associated antenna injection port 63 connection to the antenna 18 is operatively connected to the receiver logic circuit 58 for receiving power and data signals. The receiver self-test source 62 applies predetermined test signals to the antenna 18 for hardware self-tests of the receiver 16 prior to shielding integrity testing.

A mode control module 64 coupled to the receiver logic circuit 58 provides signals indicating user selections for controlling the operational modes of line power-off or power-on, warm-up, test and reset at a line 64A, 64B, 64C, 64D, respectively. Manual operation of a toggle switch provides the selected power-off or power-on signal at the line 64A. A control signal for the operational modes of warm-up, test and reset is initiated by the manual operation of a corresponding push button switch of module 64. The warm-up operational mode is initiated by the user to begin routine testing. After a RECEIVER READY indication is displayed, the test mode is initiated by the user to clear the display and to start the self-testing routines normally followed by the automatic test cycle. The reset mode is initiated by the user to clear the display.

A leakage meter 66 coupled to the receiver logic circuit 58 provides an analog display or meter reading of the detected leakage signal. The leakage meter 66 provides a relative db leakage indication above an ambient threshold level identified upon installation of the system 10. A display 68 operatively driven by the receiver logic circuit 58 includes a plurality of status indicators for viewing by the user, such as TRANSMITTER FAIL, TRANSMITTER OK, FIBER/OPTIC FAIL, FIBER/OPTIC OK, INTERLOCK OPEN, SYSTEM FAIL, RECEIVER READY/RECEIVER OK, POWER-ON, STAND-BY/WARMUP, INTERFERENCE, SHIELD FAIL, SHIELD OK and TEST IN PROGRESS. An audio tone meter 70 coupled to the receiver logic circuit 58 provides a variable audio tone pitch relative to the detected received signal energy db level. The generated variable audio tone pitch is particular useful during repeated field strength measurements for identifying a leakage point so that viewing of the meter 66 is not required.

A sensitivity control module 72 coupled to the receiver logic circuit 58 provides signals indicating user adjustments for sensitivity control and for determining a shield failure alarm relative to the selected sensitivity setting. During installation, the user adjusts the sensitivity control to provide a zero meter indication by the leakage meter 66 corresponding to a first threshold ambient level for the shielded enclosure 22. Then a setting is selected for generating the shield failure alarm, such as in a range between 6 db and 30 db, as desired for the shielded enclosure 22.

While the invention has been described with reference to details of the illustrated embodiment, these details are not intended to limit the scope of the invention as defined in the appended claims.

What is claimed and desired to be secured by Letters Patent is:

1. A shielding integrity monitoring system for monitoring the shield integrity of a shielded enclosure comprising:
   transmitter means for transmitting predetermined signals;
   receiver means separated from said transmitter means by the shielded enclosure for receiving said transmitted predetermined signals and for identifying the shielding effectiveness of the shielded enclosure; and
   fiber optic cable means connected to said transmitter means and said receiver means for communicating bidirectional signals between said transmitter means and said receiver means.

2. A shielding integrity monitoring system as recited in claim 1 wherein said transmitter means is disposed outside said shielded enclosure being monitored and said receiver means is disposed inside said shielded enclosure being monitored.

3. A shielding integrity monitoring system as recited in claim 1 wherein said transmitter means is disposed inside said shielded enclosure being monitored and said receiver means is disposed outside said shielded enclosure being monitored.

4. A shielding integrity monitoring system as recited in claim 1 wherein said fiber optic cable means include a duplex fiber optic cable.

5. A shielding integrity monitoring system as recited in claim 1 wherein said receiver means communicates a predetermined start command to said transmitter means through said fiber optic cable means, and said transmitter means being responsive to said start command for transmitting said predetermined signals and for communicating status and clock data signals to said receiver means through said fiber optic cable means.

6. A shielding integrity monitoring system as recited in claim 5 wherein said receiver means includes means for comparing said received predetermined signals and said clock data signals for identifying interference signals.

7. A shielding integrity monitoring system as recited in claim 1 wherein said transmitter means includes mode control means for selecting one of a plurality of predefined operational modes for said transmitter means.

8. A shielding integrity monitoring system as recited in claim 7 wherein said predefined operational modes for said transmitter means include an automatic cycle, said automatic cycle being performed responsive to said transmitter receiving a start command from said receiver means.

9. A shielding integrity monitoring system as recited in claim 7 wherein said predefined operational modes for said transmitter means include a locked continuous transmit cycle, and said transmitter means being responsive to said selected locked continuous transmit cycle for sequentially transmitting said predetermined signals and for sequentially communicating status and clock data signals to said receiver means through said fiber optic cable means.

10. A shielding integrity monitoring system as recited in claim 1 wherein said transmitter means includes display means for displaying operational mode and status indications.

11. A shielding integrity monitoring system as recited in claim 1 wherein said receiver means includes display means for displaying operational mode and status indications.

12. A shielding integrity monitoring system as recited in claim 1 wherein said receiver means includes portable antenna means for receiving said transmitted predetermined signals.

13. A shielding integrity monitoring system as recited in claim 12 wherein said receiver means includes audio tone means for generating a variable audio tone relative to changes in said received transmitted signals.

14. A shielding integrity monitoring system as recited in claim 1 wherein said receiver means includes analog meter means for indicating detected leakage levels responsive to said received transmitted predetermined signals.

15. A shielding integrity monitoring system as recited in claim 1 wherein said receiver means includes sensitivity control means for controlling the sensitivity of said receiver for receiving said transmitted predetermined signals.

16. A shielding integrity monitoring system as recited in claim I wherein said receiver means includes means for generating a shield failure indication responsive to a predefined value of said received transmitted predetermined signals.

17. A shielding integrity monitoring system for monitoring the shielding integrity of a shielded enclosure comprising:
   transmitter means for transmitting predetermined signals, said transmitter means including self-diagnostics means for identifying transmitter failure and for generating a transmitter status signal;

receiver means separated from said transmitter means by the shielded enclosure for receiving said transmitted predetermined signals, said receiver means including self-diagnostics means for identifying receiver failure and for generating a receiver status signal;

cable means connected to said transmitter means and said receiver means for communicating command signals from said receiver means to said transmitter means and for communicating said generated transmitter status and clock data signals to said receiver means; and said receiver means being responsive to both said generated transmitter status signal and said generated receiver status signal for identifying the shielding effectiveness of the shielded enclosure.

18. A shielding integrity monitoring system as recited in claim 17 wherein said receiver means includes means for comparing said received predetermined signals and said clock data signals for identifying interference signals.

19. A shielding integrity monitoring system as recited in claim 17 wherein said receiver means includes display means for displaying operational mode and status indications and analog meter means for indicating detected leakage levels responsive to said received transmitted predetermined signals.

20. A shielding integrity monitoring system for monitoring the shielding integrity of a shielded enclosure comprising:

transmitter means for transmitting predetermined signals, said transmitter means including means for generating clock data signals;

receiver means separated from said transmitter means by the shielded enclosure for receiving said transmitted predetermined signals;

fiber optic cable means connected to said transmitter means and said receiver means for communicating said clock data signals from said transmitter means to said receiver means; and said receiver means including means for comparing said received predetermined signals and said clock data signals for identifying interference signals, means for generating a start command, said fiber optic cable means communicating said generated start command from said receiver means to said transmitter means, and means for indicating the shielding effectiveness of the shielded enclosure.

21. A method for monitoring the shielding integrity of a shielded enclosure using a transmitter and a receiver separated by the shielded enclosure comprising the steps of:

performing self-diagnostics of the transmitter to identify predetermined transmitter operating characteristics;

performing self-diagnostics of the receiver to identify predetermined receiver operating characteristics;

transmitting predetermined signals with said transmitter responsive to said identified predetermined transmitter operating characteristics;

receiving said transmitted predetermined signals with said receiver responsive to said identified predetermined receiver operating characteristics;

indicating the shielding effectiveness of the shielded enclosure responsive to said received transmitted predetermined signals, and generating a shield failure indication responsive to a predetermined value of said received transmitted predetermined signals.

22. A method for monitoring the shielding integrity of a shielded enclosure using a transmitter and a receiver separated by the shielded enclosure and a fiber optic cable connected between the transmitter and the receiver, said method comprising the steps of:

transmitting predetermined radiated signals with said transmitter, generating clock data signals related to said transmitted predetermined radiated signals with said transmitter;

communicating said clock data signals from said transmitter means to said receiver means through said fiber optic cable;

receiving said transmitted radiated predetermined signals with said receiver;

comparing said received predetermined signals and said clock data signals for identifying interference signals with said receiver;

indicating the shielding effectiveness of the shielded enclosure with said receiver responsive to the absence of said identified interference signals, and communicating command signals from said receiver means to said transmitter means through said fiber optic cable.

* * * * *